United States Patent [19]

Utaka et al.

[11] Patent Number: 4,897,845
[45] Date of Patent: Jan. 30, 1990

[54] SEMICONDUCTOR OPTICAL AMPLIFYING ELEMENT

[75] Inventors: Katsuyuki Utaka, Musashino; Yuichi Matsushima, Tanashi; Kazuo Sakai; Shigeyuki Akiba, both of Tokyo, all of Japan

[73] Assignee: Kokusai Denshin Denwa Kabushiki Kaisha, Tokyo, Japan

[21] Appl. No.: 350,088

[22] Filed: May 10, 1989

[30] Foreign Application Priority Data

May 17, 1988 [JP] Japan ................. 63-118298

[51] Int. Cl.$^4$ .............................................. H01S 3/08
[52] U.S. Cl. ........................................ 372/45; 372/99
[58] Field of Search ............... 372/45, 49, 96, 43, 372/99, 108; 350/96.18

[56] References Cited

U.S. PATENT DOCUMENTS 4,766,470 8/1988 Scholl et al. ..................... 372/49

Primary Examiner—William L. Sikes
Assistant Examiner—B. R. R. Holloway
Attorney, Agent, or Firm—Emmanuel J. Lobato; Robert E. Burns

[57] ABSTRACT

A semiconductor optical amplifying element is disclosed which has a semiconductor multilayer structure including at least a first semiconductor layer for providing an optical gain in response to the injection of carriers thereinto, and a p-side electrode and an n-side electrode for the carrier injection. A first reflecting surface and a second reflecting surface are disposed thickwisely of the semiconductor multilayer structure and opposite to each other thereacross. The element is designed so that light incident thereon from the thickwise direction of the semiconductor multilayer structure is amplified by propagating through the element perpendicularly to the thickwise direction of the semiconductor multilayer structure while being multiple-reflected between the first reflecting surface and the second reflecting surface.

5 Claims, 4 Drawing Sheets

SEMICONDUCTOR OPTICAL AMPLIFYING ELEMENT

BACKGROUND OF THE INVENTION

The present invention relates to a semiconductor optical amplifying element for use in fiber optic communication.

Since a semiconductor optical amplifier has a high internal gain and a small size and is highly reliable, much study is being given it for use not only as a direct optical amplifying element of a nonregenerative repeating system in an intensity modulation-direct detection (IM-DD) system for fiber optic transmission and in a coherent transmission system but also as a pre-amplifier of a photodetector and a booster amplifier in an optical circuit. From the viewpoint of enhancement of system characteristics, the realization of a semiconductor optical amplifying element is highly desired which is excellent in terms of high saturation output, high gain, low noise, wide bandwidth and low polarization dependence. In this case, incident light, even if initially linearly polarized, generally becomes elliptically polarized after its long distance propagation through a fiber, and besides, the elliptically polarized wave fluctuates with the lapse of time. On this account, the intensity of output light amplified by the semiconductor optical amplifying element undergoes irregular variations, and hence no fixed gain can be obtained.

SUMMARY OF THE INVENTION

It is therefore an object of the present invention to provide a semiconductor optical amplifying element which is extremely low in its dependence on the plane of polarization of incident light.

The present invention has its feature in that light is incident on the element from the direction of the plane of the active layer, not on the end face of the element and along the active layer as in the prior art example, and the incident light is subjected to multiple reflection between a pair of reflecting surfaces provided opposite to each other across the active layer.

In accordance with the present invention, there is provided a semiconductor optical amplifying element which has a semiconductor multilayer structure including at least a first semiconductor layer for providing an optical gain in response to the injection of carriers thereinto, and a p-side electrode and an n-side electrode for the carrier injection, characterised in:

that a first reflecting surface and a second reflecting surface are disposed thickwisely of the semiconductor multilayer structure and opposite to each other thereacross; and that the element is designed so that light incident thereon from the thickwise direction of the semiconductor multilayer structure is amplified by propagating through the element perpendicularly to the thickwise direction of the semiconductor multilayer structure while being multiple-reflected between the first reflecting surface and the second reflecting surface.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention clear, prior art will first be described.

Figure 6:
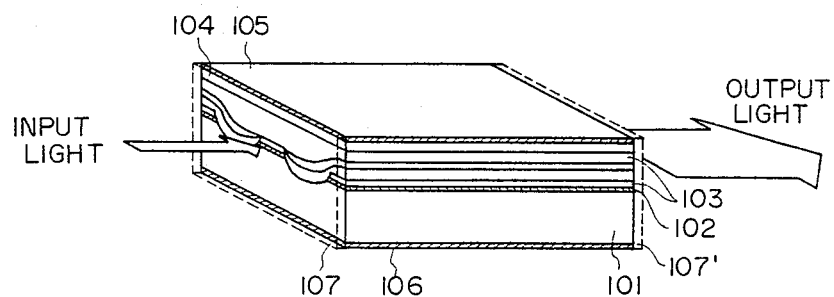
FIG. 6 is a perspective view showing a conventional semiconductor optical amplifying element.

In FIG. 6 there is shown, by way of example, a known typical semiconductor optical amplifying element and an arrangement for actuating it. This will be described on the assumption that the element has a traveling wave type structure and is formed using InGaAsP for a 1 $\mu$m wavelength band. Reference numeral 101 indicates an n-InP substrate, 102 an InGaAsP active layer, 103 a p-InP clad layer, 104 a p-InGaAsP cap layer, 105 and 106 a p-side electrode and an n-side electrode, and 107 and 107' anti-reflection (AR) films. Incident light enters the element from the one end face thereof and is amplified by controlling a voltage across the p-side electrode 105 and the n-side electrode 106 within the range in which it does not reach an oscillation threshold value, and the thus amplified light is emitted from the other end face.

With such a conventional optical amplifying element as mentioned above, its gain varies several dBs depending on whether the incident light is polarized in the direction of the longer or shorter side of the cross section of the active layer 102, because the active layer 102 has a rectangular cross section usually about 0.1 $\mu$m thick and 1 $\mu$m wide and because the AR films 107 and 107', even if having minimum reflectivity obtainable with presently available manufacturing techniques, provide a residual reflection of 1% or so. Furthermore, incident light, even if initially linearly polarized, generally becomes elliptically polarized after its long distance propagation through a fiber, and besides, the elliptically polarized wave fluctuates with the lapse of time. On this account, the intensity of output light amplified by the semiconductor optical amplifying element undergoes irregular variations, and hence no fixed gain can be obtained.

On the other hand, a multiple quantum well (MQW) structure, in which are laminated active layers 102 each having a thickness of 200 Å or thinner, that is, smaller than the de Broglie wavelength of electrons, has a large state density, and consequently, as compared with an ordinary structure having a single thick active layer, the MQW structure provides a higher gain for the same injected carrier density; conversely speaking, this structure requires a lower injected carrier density for obtaining the same gain. It is therefore expected that the application of the MQW structure to the semiconductor optical amplifying element will provide high gain, low noise characteristics. However, the gain coefficient of the MQW structure significantly depends on the direction of polarization of light, and when the incident light is polarized perpendicularly to the quantum well film, the above-mentioned high gain characteristic is impaired, and besides, the output light intensity also varies irregularly owing to the afore-mentioned fluctuation in the polarization of the incident light.

Thus there has been a strong demand for the materialization of a semiconductor optical amplifying element whose amplification factor is always constant independently of the polarization characteristic of incident light, but such a semiconductor element has not been proposed so far.

The present invention effectively eliminable of the above defects of prior art will hereinafter be described in detail with respect to its embodiments.

(EMBODIMENT 1)

Figure 1A:
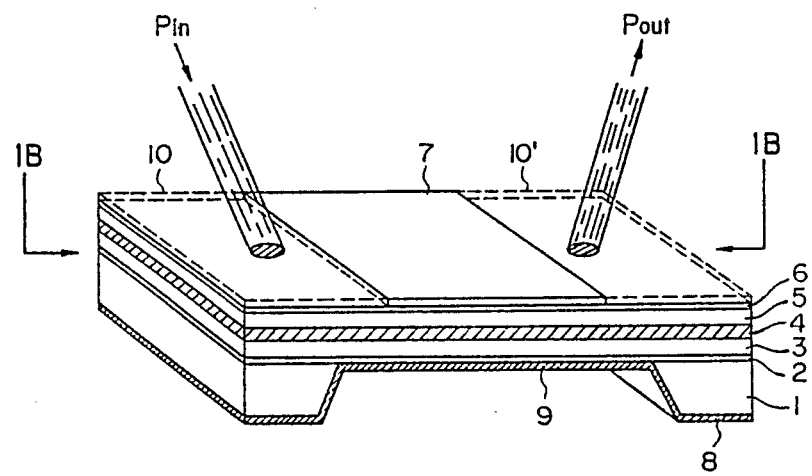
FIGS. 1A and 1B are a perspective view and a sectional view illustrating a first embodiment of the semiconductor amplifying element according to the present invention.
Figure 1B:
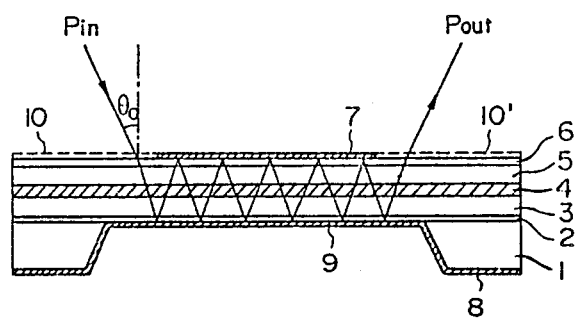

FIG. 1 illustrates a first embodiment of the present invention, FIG. 1A being a schematic diagram of the semiconductor optical amplifying element according to the present invention and FIG. 1B a sectional view taken on the line 1B—1B in FIG. 1A. This embodiment is formed using InGaAsP.

Reference numeral 1 indicates an n-InP substrate, 2 an n-InGaAsP layer, 3 an n-InP clad layer, 4 an InGaAsP active layer (a first semiconductor layer), 5 a p-InP clad layer, 6 a p-InGaAsP cap layer, and 7 and 8 a p-side electrode and an n-side electrode, respectively. The portion of the n-side electrode 8, indicated by 9, is made flat by selective etching, and the metallic films of the p-side electrode 7 and the flat portion 9 form a pair of highly reflective surfaces. Reference numerals 10 and 10' designate anti-reflection films. The respective layers are formed by an epitaxial growth method such as a liquid phase epitaxial (LPE) growth method, vapor phase epitaxial (VPE or MO-CVD) growth method, or molecular beam epitaxial (MBE) growth method. In FIG. 1B, incident light $P_{in}$ enters the element at an angle $\theta_0$ thereto through the region covered by the left-hand anti-reflection film 10 and the incident light is repeatedly reflected in zigzag between the highly reflective surfaces 7 and 9 which also act as the electrodes, as shown. At the same time, for each reflection the incident light $P_{in}$ passes through the active layer 4 which has a gain based on the injection of carriers thereinto, and as a result of this, the incident light is amplified and is then emitted as output light $P_{out}$ from the region covered by the right-hand anti-reflection film 10'. In this instance, since the propagating light passes through the active layer 4 substantially perpendicularly to its surface (in its thickwise direction) when the angle of incidence $\theta_0$ is selected to be small to some extent, the amplification factor of the element can be made almost free from its dependence upon the plane of polarization of the incident light.

Now, an example of the amplification characteristic will be described in conjunction with the schematic diagram shown in FIG. 2. Reference numerals 11 and 13 indicate clad layers, 12 an active layer, and 14 and 15 highly reflective films. For the sake of brevity, the anti-reflection films 10 and 10' shown in FIG. 1 are omitted. Letting the incident angle of the incident light $P_{in}$ be represented by $\theta_0$, the angle of travel $\theta$ of the light in the element, with respect to the normal to the element surface, is given by Snell's Law as follows:

$$\sin\theta = n_0/n_1 \sin\theta_0 \quad (1)$$

where $n_0$ and $n_1$ are the reflective indices of air and the clad layer 13. In this case, the distance $x_0$ over which the light crosses the active layer 12 of a thickness d is as follows:

$$x_0 = d/\cos\theta \quad (2)$$

Assuming that the incident light $P_{in}$ has been reflected m times prior to its emission from the element of a length L, the total distance $x_t$ of the passage of light across the active layer 12 is as follows:

$$x_t = x_0 \cdot 2m = \frac{L \cdot d}{t \cdot \sin\theta} = \frac{L \cdot d}{t} \cdot \frac{n_1}{n_0 \cdot \sin\theta_0} \quad (3)$$

where t is the distance between the both reflecting surfaces 14 and 15. For example, in a case where $\theta_0 = 34°$ ($\theta = 10°$), L=1 mm, d=0.5 μm, and t=10 μm, then $x_t = 288$ μm. In this case, a maximum gain coefficient $g_{max}$ obtainable in the active layer 12 is a gain coefficient $g_{th}$ until an oscillation perpendicular to the both reflecting surfaces 14 and 15 occurs, and this is given by the following equation:

$$g_{max} = g_{th} = \alpha_c \frac{t-d}{d} + \frac{1}{2d} \cdot l_n \frac{1}{R_1 R_2} \quad (4)$$

In the above, $\alpha_c$ is the absorption loss in the clad layer, and $R_1$ and $R_2$ are given in terms of the reflectivity of the reflecting surfaces 14 and 15, respectively. For instance, with $R_1 = R_2 = 1$ and $\alpha_c = 20$ cm$^{-1}$, then $g_{max} = 380$ cm$^{-1}$. Consequently, such as large value as follows can be obtained as the amplification degree G of the element:

$$G = 10\log\frac{P_{out}}{P_{in}} = 10\log \cdot e^{g_{max} \cdot x_t} \cong 48 \text{ dB} \quad (5)$$

Incidentally, this element has no resonators on its incidence and emission end faces and, in this sense, has a substantially ideal traveling type structure, and consequently, the anti-reflection films 10 and 10' are not essentially requisite. In this embodiment the anti-reflection films are used to prevent an increase of an unnecessary insertion loss. As will be seen from Eq. (5), the amplification factor G of the element also depends upon the total distance $x_t$ of the passage of light across the active layer 12. Hence, the total distance $x_t$ can be equivalently increased simply by reducing the incident angle $\theta_0$ (the angle of travel $\theta$) as referred to previously, or increasing the length L of the element.

(EMBODIMENT 2)

Figure 3:
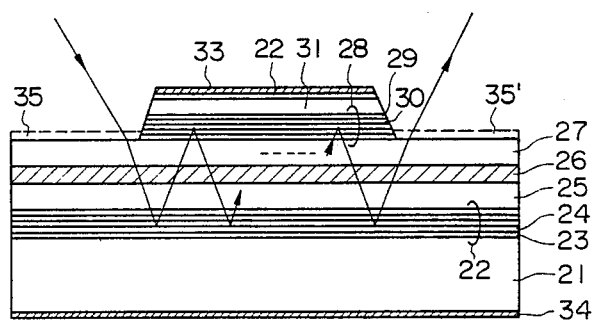
FIG. 3 is a sectional view illustrating a second embodiment of the present invention.

While the embodiment of FIG. 1 employs, as the first and second reflecting surfaces, the metallic films (7, 9) which also serve as electrodes, this embodiment, shown in FIG. 3, contemplates further reduction of loss through utilization of distributed Bragg reflectors which have periodic multilayer structures of different refractive indices. In FIG. 3 reference numeral 21 indicates an n-InP substrate, 22 a distributed Bragg reflector formed by a periodic multilayer structure comprising n-InGaAsP layers 23 and n-InP layers 24, 25 an n-InP clad layer, 26 an InGaAsP active layer, 27 a p-InP clad layer, 28 a distributed Bragg reflector made up of p-InGaAsP layers 29 and p-InP layers 30, 31 a p-InP layer, 32 a p-InGaAsP cap layer, 33 and 34 a p-side electrode and an n-side electrode, and 35 and 35' anti-reflection films. The InGaAsP layers 23 and 29 in the distributed Bragg reflectors 22 and 28 become transparent to incident light by increasing the energy gaps of the layers 23 and 29 as compared with the energy gaps of the InGaAsP active layer 26. Further, a high reflecting can be obtained by optimizing the period of lamination of the layers into each distributed Bragg reflector structure. The other principles of operation are the same as those of the embodiment of FIG. 1.

(EMBODIMENT 3)

Figure 4A:
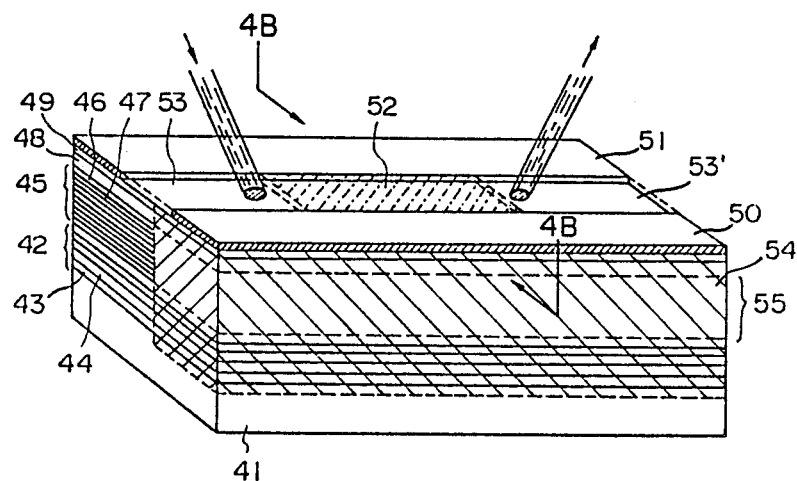
FIGS. 4A and 4B are a perspective view and a sectional view illustrating a third embodiment of the present invention.
Figure 4B:
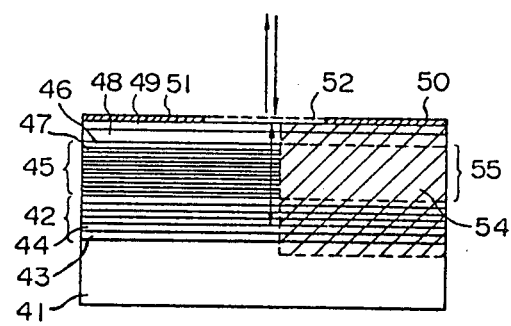

FIG. 4 illustrates a third embodiment of the present invention, FIG. 4A being a schematic diagram of the semiconductor optical amplifying element according to the present invention and FIG. 4B a sectional view taken on the line 4B—4B in FIG. 4A.

Figure 2:
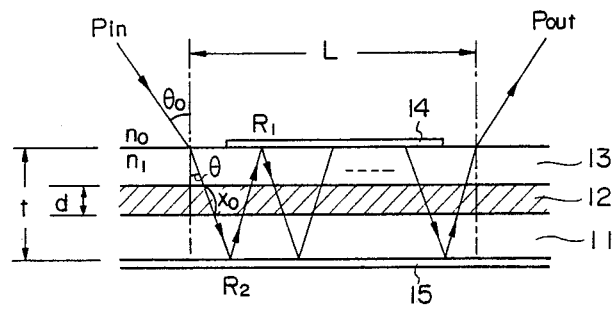
FIG. 2 is a sectional view showing the principle of operation of the present invention.

The embodiment of FIG. 4 utilizes, for injecting carriers into the active layer, what is called a Transverse Junction Stripe (TJS) structure, instead of using the structure shown in FIGS. 1, 2 and 3 in which a pn junction is formed in the interface of the active layer and the clad layer for injecting carriers into the active layer. This embodiment employs the multiple quantum well (MQW) structure for the active layer (a first semiconductor layer), a dielectric multilayer film of high reflectivity for the one reflecting surface, and the aforementioned distributed Bragg reflector for the other reflecting surface.

Reference numeral 41 indicates a semi-insulating (SI) InP substrate, 42 a distributed Bragg reflector made up of non-doped or SI-InGaAsP layers 43 and InP layers 44, 45 an active layer of a multiple quantum well (MQW) structure made up of InGaAsP well layers 46 and InP barrier layers 47 and having a thickness (<200 Å) less than the de Broglie wavelength of electrons (which active layer will hereinafter be referred to as the "MQW" layer), 48 an n-InP layer, 49 an n-InGaAsP cap layer, 50 and 51 a p-side electrode and an n-side electrode, respectively, 52 a dielectric multilayer film of high reflectivity, 53 and 53' anti-reflection films, 54 a Zn diffused region, and 55 a region in which the MQW layer 45 has been alloyed with Zn diffused. Since carriers are injected into the MQW layer 45 from the Zn diffused region, a gain region of a width substantially equal to the diffusion length of the carriers (several microns) is provided along the diffusion front. The gain region has a smaller energy gap than those of the adjoining regions, and consequently, by a suitable selection of the wavelength of incident light, its loss in the MQW layer 45 is reduced, and at the same time, a waveguiding action is created, by which the incident light is effectively confined and is amplified. Further, the use of the MQW layer as the active layer provides a high gain. This wafer can be manufactured by the MBE, MO-CVD or similar growth method which exhibit low growth rate and consequently has an excellent uniform wafer growth capability.

(EMBODIMENT 4)

Figure 5:
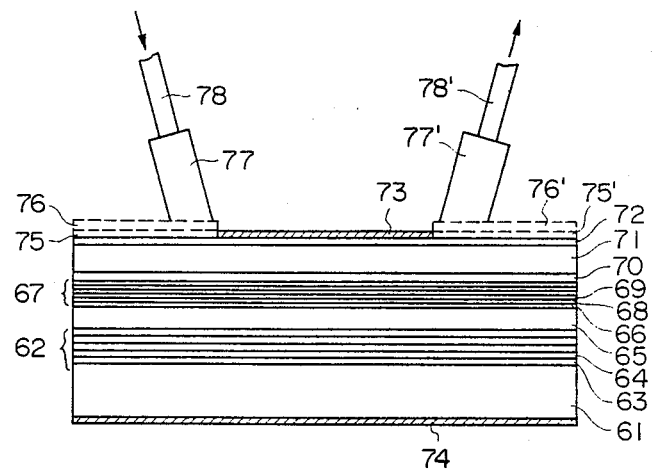
FIG. 5 is a sectional view illustrating a fourth embodiment of the present invention.

The present invention is essentially almost free from mixing of spontaneously emitted light, because the incidence and emission of light take place in the direction of its top surface. Nonetheless, an optical filter may also be provided in the optical path for further reduction of noise and for lessening the influence of degradation of the gain of an optical amplifying element of another stage. In FIG. 5, reference numeral 61 indicates an n-InP substrate, 62 a distributed Bragg reflector made up of n-InGaAsP layers 63 and n-InP layers 64, 65 an n-InP clad layer, 66 and 70 InGaAsP carrier confining layers, 67 an MQW layer comprised of InGaAs well layers and InGaAsP barrier layers 69, 71 a p-InP clad layer, 72 a p-InGaAsP cap layer, 73 a metallic film which is used both as a p-side electrode and as a reflecting surface, 74 an n-side electrode, 75 and 75' anti-reflection films, 76 and 76' band-pass type optical filters, each composed of a dielectric multilayer film, 77 and 77' rod lenses, 78 and 78' optical fibers. According to this embodiment, since the optical filters 75 and 75' can be formed by sputtering or a similar process on the wafer surface, the manufacturing process is very simple and optical filter films of excellent reproducibility can be fabricated. Besides, since an optical axis alignment for incident light and emitted light can be achieved by mounting the rod lenses 77 and 77' on the wafer surface, high coupling of light can easily be provided.

Although in any of the above-described embodiments light is entered into and emitted from the element through the wafer surface, the same results as mentioned above could be obtained even in the cases where light is entered into and emitted from the side of the substrate, where light is incident on the wafer surface but is emitted from the substrate side, and where light is incident on the substrate surface but is emitted from the wafer surface. While no particular reference has been made to a method for suppressing a transverse oscillation along the active layer, the oscillation can be prevented by depositing an anti-reflection films on either end face, forming the end faces aslant, or adding a non-exciting region. Incidentally, the embodiments have been described to be formed of the InGaAsP/InP material, but the invention can also be implemented using other materials such as InGaAlAs, AlGaAs and AlGaAsSb series.

As described above, according to the present invention, a semiconductor multilayer structure including at least an active layer and a pair of reflecting surfaces (reflectors) opposite to each other across the multilayer structure are provided and light is entered from a window made in one of the reflecting surfaces (reflectors) so that the light is multiple-reflected (substantially perpendicularly) in the direction thickwise of the active layer. By this, it is possible to obtain a semiconductor amplifying element which is extremely low in the dependence upon the plane of polarization of the incident light and is substantially constant in its amplification degree.

Further, the mixture of spontaneously emitted light is decreased by providing band-pass type optical filters in the interface for entering incident light into the element and in the interface for emitting output light from the element.

Moreover, it is possible to freely select, as the first and second reflecting surfaces, economically advantageous metallic films (7, 9, 73), which can also be used as electrodes, or semiconductor surfaces, semiconductor multilayer films (22, 28, 42, 62) which affords reduction of loss, or dielectric multilayer films (52) of high reflectivity.

A high gain can be obtained by using the MQW layer as the active layer which is the first semiconductor layer. The use of the TJS structure for injecting carriers into the active layer permits effective carrier injection even if the active layer is formed thick. Thus, the element of the present invention is very promising as a direct optical amplifying element in the IM-DD and the coherent transmission system, and hence it is of great utility when put to practical use.

What we claim is:

1. A semiconductor optical amplifying element which has a semiconductor multilayer structure including at least a first semiconductor layer for providing an optical gain in response to the injection of carriers thereinto, and a p-side electrode and an n-side electrode for the carrier injection, characterised in:

that a first reflecting surface and a second reflecting surface are disposed thickwisely of the semiconductor multilayer structure and opposite to each other thereacross; and that the element is designed so that light incident thereon from the thickwise direction of the semiconductor multilayer structure is amplified by propagating through the element perpendicularly to the thickwise direction of the semiconductor multilayer structure while being multiple-reflected between the first reflecting surface and the second reflecting surface.

2. A semiconductor optical amplifying element according to claim 1, characterized in that band-pass type optical filters are provided for permitting therethrough of the wavelengths of the incident light entered into the element and an output light emitted from the element in the thickwise direction of the semiconductor multilayer structure.

3. A semiconductor optical amplifying element according to claim 1 or 2, characterized in that the first reflecting surface and the second reflecting surface are formed by the same or a different combination of a metallic film, semiconductor multilayer films, dielectric multilayer films, and a semiconductor surface.

4. A semiconductor optical amplifying element according to claim 1 or 2, characterized in that the first semiconductor layer is formed by a multiple quantum well structure.

5. A semiconductor optical amplifying element according to claim 1 or 2, characterized in that a TJS structure is used for injecting carriers into the first semiconductor layer.

* * * * *